United States Patent
Li et al.

(10) Patent No.: US 7,030,041 B2
(45) Date of Patent: Apr. 18, 2006

(54) ADHESION IMPROVEMENT FOR LOW K DIELECTRICS

(75) Inventors: Lihua Li, San Jose, CA (US); Tzu-Fang Huang, San Jose, CA (US); Dian Sugiarto, deceased, late of Sunnyvale, CA (US); by Jerry Sugiarto, legal representative, Sunnyvale, CA (US); Li-Qun Xia, Santa Clara, CA (US); Peter Wai-Man Lee, San Jose, CA (US); Hichem M'Saad, Santa Clara, CA (US); Zhenjiang Cui, San Jose, CA (US); Sohyun Park, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/801,190

(22) Filed: Mar. 15, 2004

(65) Prior Publication Data

US 2005/0202685 A1    Sep. 15, 2005

(51) Int. Cl.
*H01L 21/31* (2006.01)
*H01L 21/469* (2006.01)

(52) U.S. Cl. .................................. 438/780

(58) Field of Classification Search ........ 438/780–781, 438/784, 787–790, 584, 618, 622, 629, 637–638
See application file for complete search history.

(56) References Cited

U.S. PATENT DOCUMENTS

| | | | |
|---|---|---|---|
| 3,510,369 A | 5/1970 | Emick et al. | |
| 4,262,631 A | 4/1981 | Kubacki | |
| 4,532,150 A | 7/1985 | Endo et al. | |
| 4,634,601 A | 1/1987 | Hamakawa et al. | |
| 4,649,071 A | 3/1987 | Tajima et al. | |
| 4,759,947 A | 7/1988 | Hishihara et al. | |
| 4,872,947 A | 10/1989 | Wang et al. | |
| 4,894,352 A | 1/1990 | Lane et al. | |
| 4,895,734 A | 1/1990 | Yoshida et al. | |
| 4,951,601 A | 8/1990 | Maydan et al. | |
| 4,981,724 A | 1/1991 | Hochberg et al. | |
| 5,000,113 A | 3/1991 | Wang et al. | |
| 5,000,178 A | 3/1991 | Griffith | |

(Continued)

FOREIGN PATENT DOCUMENTS

DE    196 54 737    12/1996

(Continued)

OTHER PUBLICATIONS

PCT International Search Report for US 02/40034, dated May 19, 2003.

(Continued)

*Primary Examiner*—David A. Zarneke
(74) *Attorney, Agent, or Firm*—Patterson & Sheridan

(57) ABSTRACT

Methods are provided for processing a substrate for depositing an adhesion layer having a low dielectric constant between two low k dielectric layers. In one aspect, the invention provides a method for processing a substrate including introducing an organosilicon compound and an oxidizing gas at a first ratio of organosilicon compound to oxidizing gas into the processing chamber, generating a plasma of the oxidizing gas and the organosilicon compound to form an initiation layer on a barrier layer comprising at least silicon and carbon, introducing the organosilicon compound and the oxidizing gas at a second ratio of organosilicon compound to oxidizing gas greater than the first ratio into the processing chamber, and depositing a first dielectric layer adjacent the dielectric initiation layer.

20 Claims, 3 Drawing Sheets

U.S. PATENT DOCUMENTS

| | | | |
|---|---|---|---|
| 5,011,706 A | 4/1991 | Tarhay et al. | |
| 5,086,014 A | 2/1992 | Miyata et al. | |
| 5,087,959 A | 2/1992 | Omori et al. | |
| 5,224,441 A | 7/1993 | Felts et al. | |
| 5,238,866 A | 8/1993 | Bolz et al. | |
| 5,242,530 A | 9/1993 | Batey et al. | |
| 5,271,972 A | 12/1993 | Kwok et al. | |
| 5,298,587 A | 3/1994 | Hu et al. | |
| 5,298,597 A | 3/1994 | You et al. | |
| 5,360,491 A | 11/1994 | Carey et al. | |
| 5,362,526 A | 11/1994 | Wang et al. | |
| 5,465,680 A | 11/1995 | Loboda | |
| 5,468,978 A | 11/1995 | Dowben | |
| 5,480,300 A | 1/1996 | Okoshi et al. | |
| 5,494,712 A | 2/1996 | Hu et al. | |
| 5,554,570 A | 9/1996 | Maeda et al. | |
| 5,565,084 A | 10/1996 | Lee et al. | |
| 5,591,566 A | 1/1997 | Ogawa | |
| 5,607,773 A | 3/1997 | Ahlbum et al. | |
| 5,638,251 A | 6/1997 | Goel et al. | |
| 5,641,607 A | 6/1997 | Ogawa et al. | |
| 5,658,834 A | 8/1997 | Dowben | |
| 5,691,209 A | 11/1997 | Liberkowski | |
| 5,710,067 A | 1/1998 | Foote et al. | |
| 5,711,987 A | 1/1998 | Bearinger et al. | |
| 5,730,792 A | 3/1998 | Camilletti et al. | |
| 5,741,626 A | 4/1998 | Jain et al. | |
| 5,776,235 A | 7/1998 | Camilletti et al. | |
| 5,780,163 A | 7/1998 | Camilletti et al. | |
| 5,789,316 A | 8/1998 | Lu | |
| 5,789,776 A | 8/1998 | Lancaster et al. | |
| 5,817,572 A | 10/1998 | Chiang et al. | |
| 5,817,579 A | 10/1998 | Ko et al. | |
| 5,818,071 A | 10/1998 | Loboda et al. | |
| 5,855,681 A | 1/1999 | Maydan et al. | |
| 5,869,396 A | 2/1999 | Pan et al. | |
| 5,876,891 A | 3/1999 | Takimoto et al. | |
| 5,926,740 A | 7/1999 | Forbes et al. | |
| 5,976,979 A | 11/1999 | Chen | |
| 5,989,998 A | 11/1999 | Sugahara et al. | |
| 6,045,877 A | 4/2000 | Gleason et al. | |
| 6,051,321 A | 4/2000 | Lee et al. | |
| 6,054,379 A | 4/2000 | Yau et al. | |
| 6,057,251 A | 5/2000 | Goo et al. | |
| 6,060,132 A | 5/2000 | Lee | |
| 6,068,884 A | 5/2000 | Rose et al. | |
| 6,071,809 A | 6/2000 | Zhao | |
| 6,072,227 A | 6/2000 | Yau et al. | |
| 6,080,526 A | 6/2000 | Yang et al. | |
| 6,107,192 A | 8/2000 | Subrahmanyan et al. | |
| 6,124,641 A | 9/2000 | Matsuura | |
| 6,140,226 A | 10/2000 | Grill et al. | |
| 6,147,009 A | 11/2000 | Grill et al. | |
| 6,153,537 A | 11/2000 | Bacchetta et al. | |
| 6,159,871 A | 12/2000 | Loboda et al. | |
| 6,242,339 B1 | 6/2001 | Aoi | |
| 6,251,770 B1 | 6/2001 | Uglow et al. | |
| 6,287,990 B1 | 9/2001 | Cheung et al. | |
| 6,291,334 B1 | 9/2001 | Somekh | |
| 6,303,523 B1 | 10/2001 | Cheung et al. | |
| 6,312,793 B1 | 11/2001 | Grill et al. | |
| 6,316,167 B1 | 11/2001 | Angelopoulos et al. | |
| 6,331,494 B1 | 12/2001 | Olson et al. | |
| 6,340,435 B1 | 1/2002 | Bjorkman et al. | |
| 6,340,628 B1 | 1/2002 | Van Cleemput et al. | |
| 6,344,693 B1 | 2/2002 | Kawahara et al. | |
| 6,348,725 B1 | 2/2002 | Cheung et al. | |
| 6,350,670 B1 | 2/2002 | Andideh et al. | |
| 6,352,945 B1 | 3/2002 | Matsuki et al. | |
| 6,362,091 B1 | 3/2002 | Andideh et al. | |
| 6,383,955 B1 | 5/2002 | Matsuki et al. | |
| 6,409,238 B1 | 6/2002 | Mikenis et al. | |
| 6,410,462 B1 | 6/2002 | Yang et al. | |
| 6,410,463 B1 | 6/2002 | Matsuki et al. | |
| 6,413,583 B1 | 7/2002 | Moghadam et al. | |
| 6,432,846 B1 | 8/2002 | Matsuki et al. | |
| 6,436,824 B1 | 8/2002 | Chool et al. | |
| 6,437,443 B1 | 8/2002 | Grill et al. | |
| 6,441,491 B1 | 8/2002 | Grill et al. | |
| 6,444,568 B1 | 9/2002 | Sundararajan et al. | |
| 6,455,445 B1 | 9/2002 | Matsuki et al. | |
| 6,465,366 B1 | 10/2002 | Nemani et al. | |
| 6,479,110 B1 | 11/2002 | Grill et al. | |
| 6,479,409 B1 | 11/2002 | Shioya et al. | |
| 6,486,061 B1 | 11/2002 | Xia et al. | |
| 6,486,082 B1 | 11/2002 | Cho et al. | |
| 6,489,238 B1 | 12/2002 | Tsui | |
| 6,500,773 B1 | 12/2002 | Gaillard et al. | |
| 6,511,903 B1 | 1/2003 | Yau et al. | |
| 6,511,909 B1 | 1/2003 | Yau et al. | |
| 6,521,300 B1 | 2/2003 | Hsieh et al. | |
| 6,521,302 B1 | 2/2003 | Campana-Schmitt et al. | |
| 6,528,423 B1 | 3/2003 | Catabay et al. | |
| 6,531,714 B1 | 3/2003 | Bacchetta et al. | |
| 6,532,150 B1 | 3/2003 | Sivertsen et al. | |
| 6,537,733 B1 | 3/2003 | Campana et al. | |
| 6,537,929 B1 | 3/2003 | Cheung et al. | |
| 6,541,282 B1 | 4/2003 | Cheung et al. | |
| 6,541,369 B1 | 4/2003 | Huang et al. | |
| 6,541,398 B1 | 4/2003 | Grill et al. | |
| 6,548,899 B1 | 4/2003 | Ross | |
| 6,555,476 B1 | 4/2003 | Olsen et al. | |
| 6,559,520 B1 | 5/2003 | Matsuki et al. | |
| 6,562,690 B1 | 5/2003 | Cheung et al. | |
| 6,570,256 B1 | 5/2003 | Conti et al. | |
| 6,573,196 B1 | 6/2003 | Gaillard et al. | |
| 6,582,777 B1 | 6/2003 | Ross et al. | |
| 6,583,048 B1 | 6/2003 | Vincent et al. | |
| 6,583,071 B1 | 6/2003 | Weidman et al. | |
| 6,592,890 B1 | 7/2003 | Green | |
| 6,593,247 B1 | 7/2003 | Huang et al. | |
| 6,593,633 B1 | 7/2003 | Jan et al. | |
| 6,593,653 B1 | 7/2003 | Sundararajan et al. | |
| 6,596,655 B1 | 7/2003 | Cheung et al. | |
| 6,605,549 B1 | 8/2003 | Leu et al. | |
| 6,624,053 B1 | 9/2003 | Passemard | |
| 6,627,532 B1 | 9/2003 | Gaillard et al. | |
| 6,642,157 B1 | 11/2003 | Shioya et al. | |
| 6,645,883 B1 | 11/2003 | Yamamoto et al. | |
| 6,649,531 B1 * | 11/2003 | Cote et al. | 438/714 |
| 6,656,837 B1 * | 12/2003 | Xu et al. | 438/676 |
| 6,660,391 B1 | 12/2003 | Rose et al. | |
| 6,660,656 B1 | 12/2003 | Cheung et al. | |
| 6,660,663 B1 | 12/2003 | Cheung et al. | |
| 6,673,725 B1 | 1/2004 | Shioya et al. | |
| 6,703,302 B1 | 3/2004 | Miyajima et al. | |
| 6,713,390 B1 * | 3/2004 | M'Saad et al. | 438/680 |
| 6,730,593 B1 | 5/2004 | Yau et al. | |
| 6,734,115 B1 | 5/2004 | Cheung et al. | |
| 6,734,533 B1 | 5/2004 | Wong | |
| 6,737,365 B1 | 5/2004 | Kloster et al. | |
| 6,740,539 B1 | 5/2004 | Conti et al. | |
| 6,756,323 B1 | 6/2004 | Grill et al. | |
| 6,756,674 B1 | 6/2004 | Catabay et al. | |
| 6,759,327 B1 | 7/2004 | Xia et al. | |
| 6,770,573 B1 | 8/2004 | Grill et al. | |
| 6,784,119 B1 | 8/2004 | Gaillard et al. | |
| 6,790,789 B1 | 9/2004 | Grill et al. | |
| 6,806,185 B1 | 10/2004 | Li et al. | |
| 6,806,207 B1 | 10/2004 | Huang et al. | |
| 6,844,612 B1 | 1/2005 | Tian et al. | |
| 6,849,561 B1 | 2/2005 | Goundar et al. | |
| 6,887,780 B1 | 5/2005 | Andideh et al. | |
| 6,902,440 B1 | 6/2005 | Dougan et al. | |

| | | |
|---|---|---|
| 6,903,004 B1 | 6/2005 | Spencer et al. |
| 6,913,992 B1 | 7/2005 | Schmitt et al. |
| 2001/0005546 A1 | 6/2001 | Cheung et al |
| 2002/0000670 A1 | 1/2002 | Yau et al. |
| 2002/0054962 A1 | 5/2002 | Huang |
| 2002/0054982 A1 | 5/2002 | Dietrich et al. |
| 2002/0093075 A1 | 7/2002 | Gates et al. |
| 2002/0098714 A1 | 7/2002 | Grill et al. |
| 2002/0111042 A1 | 8/2002 | Yau et al. |
| 2002/0160626 A1 | 10/2002 | Matsuki et al. |
| 2002/0172766 A1 | 11/2002 | Laxman et al. |
| 2002/0182894 A1 | 12/2002 | Andideh |
| 2003/0001282 A1 | 1/2003 | Meynen et al. |
| 2003/0003765 A1 | 1/2003 | Gibson, Jr. et al. |
| 2003/0022526 A1 | 1/2003 | Vyvoda et al. |
| 2003/0032274 A1 | 2/2003 | Daniels et al. |
| 2003/0035904 A1 | 2/2003 | Hsieh et al. |
| 2003/0042605 A1 | 3/2003 | Andideh et al. |
| 2003/0064154 A1 | 4/2003 | Laxman et al. |
| 2003/0064607 A1 | 4/2003 | Leu et al. |
| 2003/0068881 A1 | 4/2003 | Xia et al. |
| 2003/0077916 A1 | 4/2003 | Xu et al. |
| 2003/0089988 A1 | 5/2003 | Matsuura |
| 2003/0111730 A1 | 6/2003 | Takeda et al. |
| 2003/0129827 A1 | 7/2003 | Lee et al. |
| 2003/0139035 A1 | 7/2003 | Yim et al. |
| 2003/0139062 A1 | 7/2003 | Grill et al. |
| 2003/0194495 A1 | 10/2003 | Li et al. |
| 2003/0198742 A1 | 10/2003 | Vrtis |
| 2003/0211244 A1 | 11/2003 | Li et al. |
| 2003/0232495 A1 | 12/2003 | Moghadam et al. |
| 2004/0002208 A1 | 1/2004 | Yukio et al. |
| 2004/0048490 A1 | 3/2004 | Tsuji et al. |
| 2004/0076764 A1 | 4/2004 | Forester et al. |
| 2004/0076767 A1 | 4/2004 | Satoh et al. |
| 2004/0084774 A1* | 5/2004 | Li et al. .................... 257/758 |
| 2004/0096593 A1 | 5/2004 | Lukas et al. |
| 2004/0096672 A1 | 5/2004 | Lukas et al. |
| 2004/0137728 A1* | 7/2004 | Gallagher et al. .......... 438/689 |
| 2004/0155340 A1 | 8/2004 | Owada et al. |
| 2004/0166665 A1 | 8/2004 | Gaillard et al. |
| 2004/0175929 A1* | 9/2004 | Schmitt et al. ............. 438/628 |
| 2004/0175957 A1 | 9/2004 | Lukas et al. |
| 2004/0195693 A1 | 10/2004 | Koister et al. |
| 2004/0235291 A1* | 11/2004 | Mandal ....................... 438/633 |
| 2004/0253388 A1 | 12/2004 | Kim |
| 2005/0009320 A1* | 1/2005 | Goundar ..................... 438/624 |
| 2005/0026422 A1 | 2/2005 | Kim et al. |
| 2005/0051900 A1 | 3/2005 | Liu et al. |
| 2005/0059258 A1 | 3/2005 | Edelstein et al. |
| 2005/0064726 A1 | 3/2005 | Reid et al. |
| 2005/0118799 A1 | 6/2005 | Wu |
| 2005/0130405 A1 | 6/2005 | Spencer et al. |
| 2005/0140029 A1 | 6/2005 | Li et al. |

FOREIGN PATENT DOCUMENTS

| | | |
|---|---|---|
| DE | 199 04 311 | 8/1999 |
| EP | 0 613 178 | 2/1994 |
| EP | 0 725 440 | 8/1996 |
| EP | 1 029 728 | 8/2000 |
| EP | 1 107 303 | 6/2001 |
| EP | 1 176 226 | 1/2002 |
| EP | 1 176 226 A1 | 1/2002 |
| EP | 1 354 980 | 10/2003 |
| JP | 09-008031 | 1/1997 |
| JP | 9-237785 | 7/1997 |
| JP | 09-320075 | 12/1997 |
| JP | 09-321175 | 12/1997 |
| WO | WO 99/21706 | 5/1999 |
| WO | WO 99/33102 | 7/1999 |
| WO | WO 99/41423 | 8/1999 |
| WO | WO 00/19498 | 4/2000 |
| WO | WO 00/20900 | 4/2000 |
| WO | WO 01/61737 | 8/2001 |

OTHER PUBLICATIONS

Wu, et al. "Advanced Metal Barrier Free Cu Damascene Interconnects with PECVD Silicon Carbide Barriers for 90/65nm BEOL Technology", 2002 IEEE, IEDM pp. 595-598.

U.S. Appl. No. 10/383,837, filed Mar. 7, 2003.

Dijkstra et al., "Optimization of Anti-Reflection Layers for Deep UV Lithography", Proceedings of SPIE Optical/Laser Microlithography, Bellingham, SPIE, vol. 1927, 1993, pp. 275-286.

Fukuda, et al. "Highly Reliable SiOF Film Formation by ECR-CVD Using SiF2H2", Symposium on VLSI Technology Digest of Technical Papers IEEE (1996) pp. 114-115.

Ogawa et al., "Novel ARC Optimization Methodology for KrF Excimer Laser Lithography at Low K1 Factor", *Proceedings of the SPIE. Optical/Laser Microlithography V*, vol. 1674, 1992, pp. 362-375.

Omar, M.A., "Elementary Solid State Physics: Principles and Applications," Lowell Technological Institute, Addison-Wesley Publishing Company, © 1975, pp.: 124, 125.

PCT International Search Report dated Feb. 11, 2000 for PCT/US99/22425.

PCT International Search Report for PCT/US2004/006849, dated Jan. 19, 2005.

PCT International Search Report for US/02/36229, dated Sep. 3, 2003.

PCT International Written Opinion for PCT/US2004/006849, dated Jan. 19, 2005.

PCT Partial International Search Report dated Mar. 21, 2000, for PCT/US99/22317.

PCT Partial International Search Report for PCT/US2004/006849, dated Oct. 15, 2004.

PCT/International Search Report for US/02/40034 dated May 19, 2003.

Tajima, et al. "Characterization of Plasma Polymers from Tetramethysilane, Octamethylcyclotetrasiloxane, and Methyltrimethoxysilane" Journal of Polymer Science: Part A: Polymer Chemistry, vol. 25 (1987) pp. 1737-1744.

U.S. Appl. No. 09/270,039, filed on Mar. 16, 1999, Huang.

U.S. Appl. No. 11/142,124, filed on Jun. 1, 2005.

Written Opinion, from PCT/US99/22424, dated Apr. 5, 2001.

Wu, et al "Advanced Metal Barrier Free Cu Damascene Interconnects with PECVD Silicon Carbide Barriers for 90/65-nm BEOL Technology", 2002 IEEE, IEDM pp. 595-598.

PCT International Search Report and Written Opinion for PCT/US2005/008445, dated Jul. 25, 2005.

* cited by examiner

ADHESION IMPROVEMENT FOR LOW K DIELECTRICS

BACKGROUND OF THE DISCLOSURE

1. Field of the Invention

The invention relates to the fabrication of integrated circuits and to a process for depositing dielectric layers on a substrate and the structures formed by the dielectric layer.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where heat-induced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 μm and even 0.18 μm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant<4.0) to also reduce the capacitive coupling between adjacent metal lines. One such low k dielectric material is spin-on glass, such as un-doped silicon glass (USG) or fluorine-doped silicon glass (FSG), which can be deposited as a gap fill layer in a semiconductor manufacturing process. Another low k dielectric material is silicon oxycarbide that can used as a dielectric layer in fabricating damascene features.

One conductive material gaining acceptance is copper and its alloys, which have become the materials of choice for sub-quarter-micron interconnect technology because copper has a lower resistivity than aluminum, (1.7 μΩ-cm compared to 3.1 μΩ-cm for aluminum), a higher current and higher carrying capacity. These characteristics are important for supporting the higher current densities experienced at high levels of integration and increased device speed. Further, copper has good thermal conductivity and is available in a very pure state.

One difficulty in using copper in semiconductor devices is that copper is difficult to etch to achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, are then removed.

However, when silicon oxycarbide layers and silicon carbide layers are used as the low k material in damascene formation, less than satisfactory interlayer adhesion has been observed during processing. Some techniques for processing substrates may apply forces that can increase layering defects, such as layer delamination. For example, excess copper containing materials may be removed by mechanical abrasion between a substrate and a polishing pad in a chemical mechanical polishing process, and the force between the substrate and the polishing pad may induce stresses in the deposited low k dielectric materials to result in layer delamination. In another example, annealing of deposited materials may induce high thermal stresses that can also lead to delamination in low k dielectric materials.

Therefore, there remains a need for a process for improving interlayer adhesion between low k dielectric layers.

SUMMARY OF THE INVENTION

Aspects of the invention generally provide a method for depositing an adhesion layer having a low dielectric constant between two low k dielectric layers. In one aspect, the invention provides a method for processing a substrate including positioning the substrate in a processing chamber, wherein the substrate has a barrier layer comprising at least silicon and carbon, introducing an organosilicon compound and an oxidizing gas at a first ratio of organosilicon compound to oxidizing gas into the processing chamber, generating a plasma of the oxidizing gas and the organosilicon compound to form an initiation layer on the barrier layer, introducing the organosilicon compound and the oxidizing gas at a second ratio of organosilicon compound to oxidizing gas greater than the first ratio into the processing chamber, and depositing a first dielectric layer adjacent the dielectric initiation layer, wherein the dielectric layer comprises silicon, oxygen, and carbon and has a dielectric constant of about 3 or less.

In another aspect of the invention, a method is provided for processing a substrate including positioning the substrate in a processing chamber, wherein the substrate has a barrier layer comprising silicon, nitrogen, and carbon, introducing an inert gas into the processing chamber, generating a first plasma from a single-frequency RF power source to modify a surface of the barrier layer, introducing an organosilicon compound and an oxidizing gas in a ratio of about 1:1 into the processing chamber, generating a second plasma from a dual-frequency RF power source to form an initiation layer on the barrier layer, introducing the organosilicon compound and the oxidizing gas in a ratio of greater than about 10:1 into the processing chamber, and depositing a first dielectric layer adjacent the dielectric initiation layer, wherein the dielectric layer comprises silicon, oxygen, and carbon and has a dielectric constant of about 3 or less.

In another aspect of the invention, a method is provided for processing a substrate including positioning the substrate in a processing chamber, wherein the substrate has a barrier layer comprising at least silicon and carbon, introducing an oxidizing gas into the processing chamber, generating a plasma of the oxidizing gas and treating a surface of the barrier layer, introducing an organosilicon compound at a first flow rate, depositing an initiation layer on the barrier layer from the oxidizing gas and the organosilicon compound, introducing the organosilicon compound at a second flow rate greater than the first flow rate, depositing a first dielectric layer adjacent the dielectric initiation layer from the oxidizing gas and the organosilicon compound, wherein the dielectric layer comprises silicon, oxygen, and carbon and has a dielectric constant of about 3 or less.

In another aspect of the invention, a method is provided for processing a substrate including positioning the substrate in a processing chamber, wherein the substrate has a barrier layer comprising at least silicon and carbon, introducing an oxidizing gas into the processing chamber, generating a plasma of the oxidizing gas and forming an initiation layer on the barrier layer, introducing an organosilicon compound into the processing chamber, reacting the organosilicon compound and the oxidizing gas, and depositing a first dielectric layer adjacent the initiation layer, wherein the dielectric layer comprises silicon, oxygen, and carbon and has a dielectric constant of about 3 or less.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION OF THE PREFERRED EMBODIMENTS

Aspects of the invention described herein refer to a method and apparatus for depositing an adhesive dielectric material and/or treating the surface between dielectric layers to improve interlayer adhesion of dielectric layers. Improving interlayer adhesion may comprise forming a dielectric initiation layer before depositing a subsequent dielectric layer. The initiation layer may comprise silicon, carbon, and optionally, oxygen. Treatments to improve adhesion between the dielectric layers include modifying the surface of a deposited layer prior to subsequent deposition, for example, the application of a plasma treatment of an inert gas, an oxidizing gas, or both. Treating of the surface of a silicon, carbon, and optionally, oxygen containing material is believed to form a more oxide-like surface on the deposited material to thereby improve interlayer adhesion.

Deposition of a Dual Damascene Structure

Figure 1:
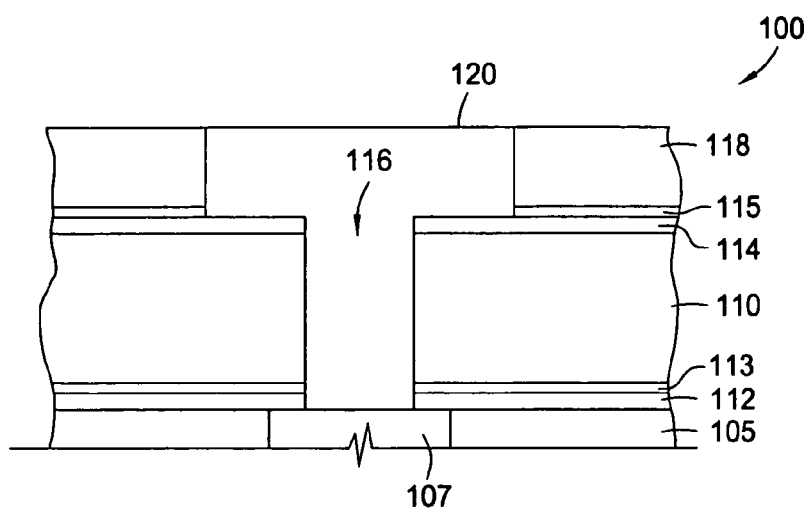
FIG. 1 is a cross-sectional view showing a dual damascene structure comprising the silicon carbide and silicon oxycarbide layers described herein.

A damascene structure that is formed using the deposition processes described herein for a silicon oxycarbide layer disposed on a silicon carbide layer is shown in FIG. 1. The following structure forming process as described in FIGS. 1 and 2A–2H are illustrative and should not be construed or interpreted as limiting the scope of the invention. While the following interlayer adhesion processes are used between a silicon carbide barrier layer 112 and a dielectric layer 110 as well as a low k etch stop layer 114 and an interlayer dielectric layer 118, the invention contemplates that the interlayer adhesion processes may be used between any suitable dielectric layers in a damascene structure or dielectric stack.

A substrate 100 having metal features 107 formed in a substrate surface material 105 therein is provided to a processing chamber. A first silicon carbide barrier layer 112 is generally deposited on the substrate surface to eliminate inter-level diffusion between the substrate and subsequently deposited material. The first silicon carbide barrier layer 112 may be nitrogen and/or oxygen doped. Barrier layer materials may have dielectric constants of up to about 9, such as 4 or less, and preferably between about 2.5 and less than about 4. Silicon carbide barrier layers may have dielectric constants of about 5 or less, preferably less than about 4. A capping layer of nitrogen free silicon carbide (not shown) may be deposited in situ on the first silicon carbide barrier layer 112 by minimizing or eliminating the nitrogen source gas. An initiation layer 113 may be deposited on the first silicon carbide barrier layer 112, and a pre-treatment process as described herein may be used prior to depositing the initiation layer 113.

The first dielectric layer 110 of the oxidized organosilicon compound is deposited on initiation layer 113. The first dielectric layer 110 may then be post-treated with a plasma or e-beam process. Alternatively, a silicon oxide cap layer (not shown) may be deposited in situ on the first dielectric layer 110 by increasing the oxygen concentration in the silicon oxycarbide deposition process described herein to remove carbon from the deposited material.

An etch stop (or second barrier layer) 114 of a silicon carbide, which may be doped with nitrogen or oxygen, is then deposited on the first dielectric layer 110. The etch stop 114 may have a nitrogen free silicon carbide capping layer deposited thereon. The etch stop 114 is then pattern etched to define the openings of the contacts/vias 116. An interlayer adhesion layer or initiation layer 115 as described herein may be formed on the layer 114 prior to subsequent processing, such as etching or additional dielectric etching, to improve interlayer adhesion with subsequently deposited dielectric materials. The improved adhesion layer may comprise the pre-treatment process and initiation layer as described herein. The interlayer adhesion surface may be formed by the techniques described herein. A second dielectric layer 118 of an oxidized organosilane or organosiloxane is then deposited over the patterned etch stop. The second dielectric layer 118 may then be plasma or e-beam treated and/or have a silicon oxide cap material disposed thereon by the process described herein.

A resist 122, conventionally known in the art, such as photoresist material UV-5, commercially available from Shipley Company Inc., of Marlborough, Mass., is then deposited and patterned by conventional means known in the art to define the interconnect lines 120. A single etch process is then performed to define the interconnect down to the etch stop and to etch the unprotected dielectric exposed by the patterned etch stop to define the contacts/vias.

Figure 2A:
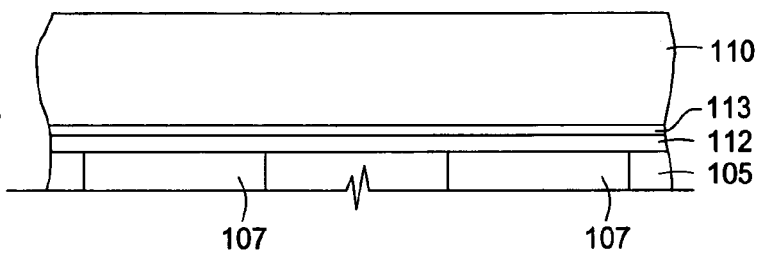
FIGS. 2A–H are cross-sectional views showing one embodiment of a dual damascene deposition sequence of the invention.
Figure 2B:
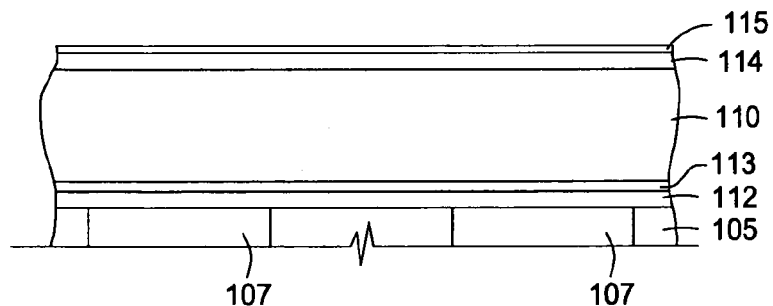
Figure 2C:
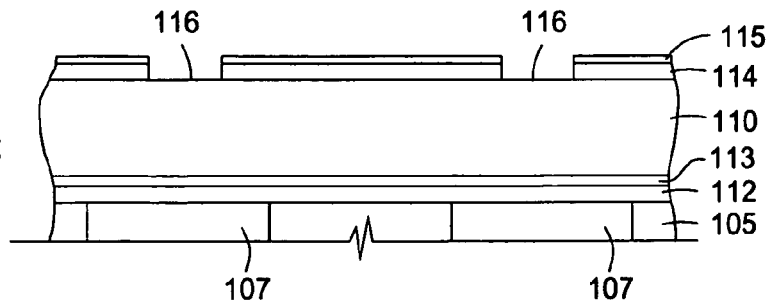
Figure 2D:
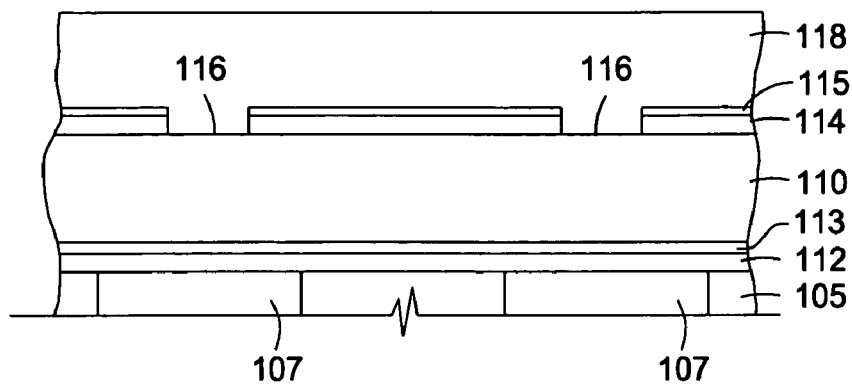
Figure 2E:
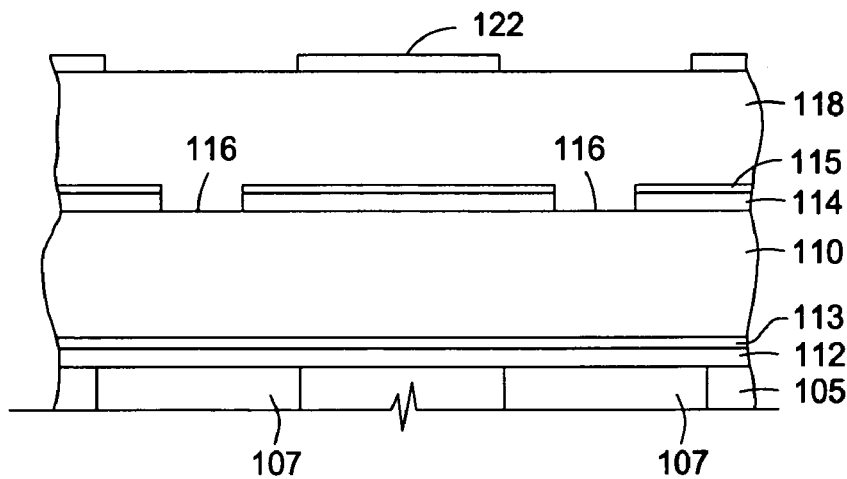

A preferred dual damascene structure fabricated in accordance with the invention includes the plasma treatment or e-beam treatment of an exposed silicon oxycarbide layer as shown in FIG. 2E, and the method of making the structure is sequentially depicted schematically in FIGS. 2A–2H, which are cross-sectional views of a substrate having the steps of the invention formed thereon.

As shown in FIG. 2A, a first silicon carbide barrier layer 112 is deposited on the substrate surface. The silicon carbide material of the first silicon carbide barrier layer 112 may be doped with nitrogen and/or oxygen. While not shown, a capping layer of nitrogen free silicon carbide or silicon oxide may be deposited on the barrier layer 112. The nitrogen free silicon carbide or silicon oxide may be deposited in situ by adjusting the composition of the processing gas.

The initiation layer 113 may be deposited by a plasma treatment of the first silicon carbide barrier layer 112 followed by the actual initiation layer material deposition; both processes may be performed sequentially in situ. Helium (He), argon (Ar), neon (Ne), and combinations thereof, may be used for the plasma treatment.

An example of the inert gas pre-treatment process comprises providing helium to a processing chamber at a flow rate of about 1500 sccm, maintaining a chamber pressure of about 5 Torr, maintaining a substrate temperature of about 350° C., positioning a gas distributor at about 450 mils from the substrate surface, and generating a plasma by applying a RF power level of about 300 W at a high frequency of about 13.56 MHz for a period of 15 seconds.

An example of a deposition of initiation layer 113 comprises introducing oxygen at a flow rate of 500 sccm into the processing chamber, introducing octamethylcyclotetrasiloxane at a flow rate of about 500 milligrams/minute (mgm) (which corresponds to about 39 sccm for OMCTS), introducing helium at a flow rate of about 4800 sccm, maintaining the chamber at a substrate temperature of about 350° C., maintaining a chamber pressure of about 5 Torr, positioning a gas distributor at about 350 mils from the substrate surface, and applying a RF power of about 500 watts at 13.56 Mhz and about 150 watts at 356 KHz.

An initial first dielectric layer 110 of silicon oxycarbide from an oxidized organosilane or organosiloxane by the process described herein, such as trimethylsilane and/or octamethylcyclotetrasiloxane, is deposited on initiation layer 113 to a thickness of about 5,000 to about 15,000 Å, depending on the size of the structure to be fabricated. The first dielectric layer may also comprise other low k dielectric material such as a low polymer material including paralyne or a low k spin-on glass such as un-doped silicon glass (USG) or fluorine-doped silicon glass (FSG). The first dielectric layer may then be treated by a plasma process as described herein.

As shown in FIG. 2B, the low k etch stop 114, which may be nitrogen and/or oxygen doped silicon carbide, is then deposited on the first dielectric layer to a thickness of about 100 Å to about 1000 Å. An interlayer dielectric adhesion layer or surface 115 formed by one of the processes described herein, such as a dielectric initiation layer, is then formed or deposited on the low k etch stop layer 114. The low k etch stop 114 and/or interlayer dielectric adhesion layer or surface 115 may be plasma treated as described herein for the silicon carbide materials or silicon oxycarbide materials. Layer 115 may be deposited as described for initiation layer 113.

The low k etch stop 114 is then pattern etched to define the contact/via openings 116 and to expose first dielectric layer 110 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 10 Å to about 500 Å may be deposited on the low k etch stop 114 and/or interlayer dielectric adhesion layer or surface 115 prior to depositing further materials.

After low k etch stop 114 has been etched to pattern the contacts/vias and the resist material has been removed, a second dielectric layer 118 of silicon oxycarbide from an oxidized organosilane or organosiloxane by the process described herein, such as trimethylsilane, is deposited to a thickness of about 5,000 to about 15,000 Å as shown in FIG. 2D. The second dielectric layer 118 may then be treated by a plasma process as described herein for first dielectric layer 110.

Figure 2F:
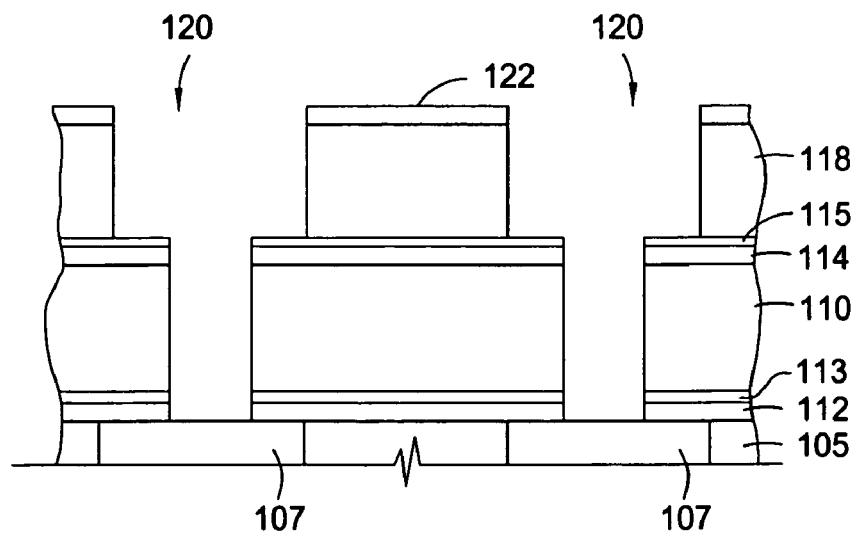

A resist material 122 is then deposited on the second dielectric layer 118 (or cap layer) and patterned: preferably using conventional photolithography processes to define the interconnect lines 120 as shown in FIG. 2E. The resist material 122 comprises a material conventionally known in the art, preferably a high activation energy resist material, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any resist material or other material used to pattern the etch stop 114 or the second dielectric layer 118 is removed using an oxygen strip or other suitable process.

Figure 2G:
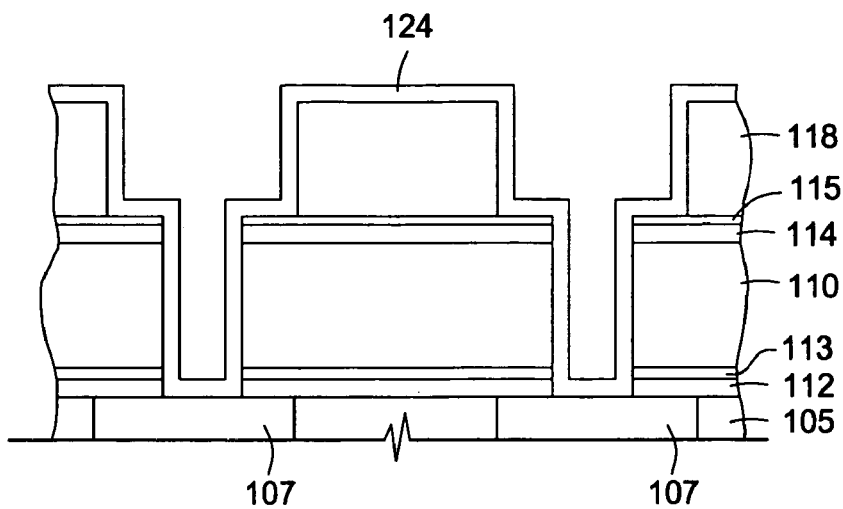
Figure 2H:
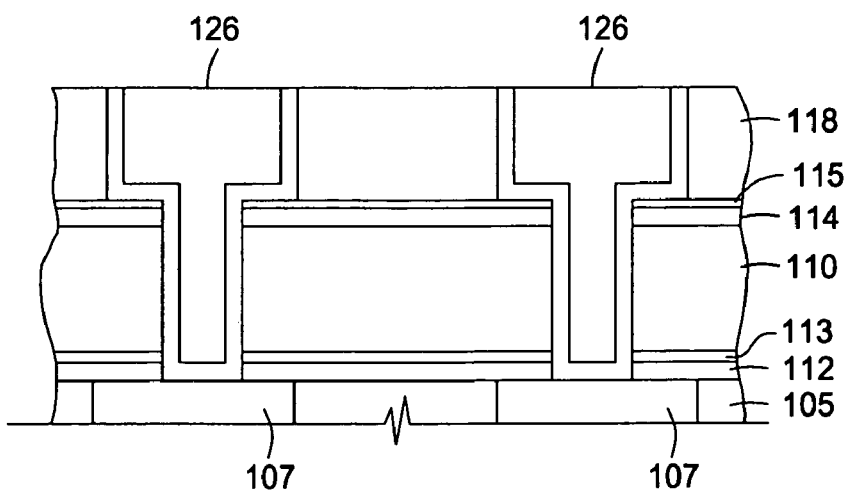

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable metal barrier layer 124, such as tantalum nitride, is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other conductive metal, the surface is planarized using chemical mechanical polishing, as shown in FIG. 2H.

Initiation Layer Deposition

In one aspect, interlayer adhesion may be improved by depositing an initiation layer prior to depositing the silicon oxycarbide layer. Optionally, a pre-treatment process of the underlying dielectric layer, such as silicon carbide or doped silicon carbide, may be performed prior to deposition of the initiation layer. The application of the RF power to generate a plasma may not end during gas transition between pre-treatment steps and/or deposition steps.

The following deposition processes are described with use of the 300 mm Producer™ dual deposition station processing chamber, and should be interpreted accordingly, for example, flow rates are total flow rates and should be divided by two to describe the process flow rates at each deposition station in the chamber. Additionally, it should be noted that the respective parameters may be modified to perform the plasma processes in various chambers and for different substrate sizes, such as for 200 mm substrates.

The deposition processes described herein may be performed in one continuous plasma process, or comprise two or more generated plasma, for example, one for each layer deposition step. The pre-treatment and deposition processes described herein may also be performed in one continuous plasma process, or comprise two or more generated plasma, for example, one generated plasma for the pretreatment process and one or more generated plasma for the layer deposition steps; or one plasma for the pre-treatment process and initiation layer deposition step and a second generated plasma for the dielectric deposition step.

The pre-treatment process comprises a plasma treatment of the underlying dielectric using an inert gas, an oxidizing gas, or both. The plasma treatment is believed to form a surface of the underlying dielectric material more similar to the subsequently deposited material. For example, it is believed the oxygen plasma creates a more oxide like surface. The plasma treatment may be performed in the same chamber used to deposit the silicon oxycarbide material.

One embodiment of the plasma treatment comprises providing an inert gas, including helium, argon, neon, xenon, krypton, or combinations thereof, to a processing chamber at a flow rate between about 500 sccm and about 3000 sccm, maintaining a chamber pressure between about 3 Torr and about 12 Torr, maintaining a substrate temperature between about 300° C. and about 450° C., positioning a gas distributor, or "showerhead" that may be positioned between about 200 mils and about 1000 mils, for example between 300 mils and 500 mils from the substrate surface, and generating a plasma by applying a power density ranging between about 0.03 W/cm$^2$ and about 3.2 W/cm$^2$, which is a RF power level of between about 10 W and about 1000 W for a 200 mm substrate, at a high frequency such as between 13 MHz and 14 MHz, for example, 13.56 MHz. The plasma treatment may be performed between about 3 seconds and about 120 seconds, for example, between about 5 seconds and about 40 seconds preferably used.

The plasma may be generated by a dual-frequency RF power source as described herein. Alternatively, all plasma generation may be performed remotely, with the generated radicals introduced into the processing chamber for plasma treatment of a deposited material or deposition of a material layer.

An example of the inert gas pre-treatment process comprises providing helium to a processing chamber at a flow rate of about 1500 sccm, maintaining a chamber pressure of about 5 Torr, maintaining a substrate temperature of about 350° C., positioning a gas distributor at about 450 mils from the substrate surface, and generating a plasma by applying a RF power level of about 300 W at a high frequency of about 13.56 MHz for a period of 15 seconds.

The pre-treatment plasma process may utilize an oxidizing gas, such as oxygen, with or without the inert gas described above. The oxidizing pre-treatment process may comprise providing an oxidizing gas, such as oxygen or other oxidizing gas described herein, to a processing chamber at a flow rate between about 100 sccm and about 3000 sccm, maintaining a chamber pressure between about 2 Torr and about 12 Torr, maintaining a substrate temperature between about 250° C. and about 450° C., positioning a gas distributor, or "showerhead" that may be positioned between about 200 mils and about 1000 mils, for example between about 300 mils and about 500 mils from the substrate surface, and generating a plasma by applying a power density ranging between about 0.03 W/cm$^2$ and about 3.2 W/cm$^2$, which is a RF power level of between about 10 W and about 1000 W for a 200 mm substrate, at a high frequency such as between 13 MHz and 14 MHz, for example, 13.56 MHz. The plasma treatment may be performed between about 3 seconds and about 120 seconds, with a plasma treatment between about 5 seconds and about 40 seconds preferably used.

An example of the oxidizing gas pre-treatment process comprises providing oxygen to a processing chamber at a flow rate of about 750 sccm (about 1500 sccm for a dual station Producer™ plasma chamber), maintaining a chamber pressure of about 5 Torr, maintaining a substrate temperature of about 350° C., positioning a gas distributor at about 450 mils from the substrate surface, and generating a plasma by applying a RF power level of about 300 W at a high frequency of about 13.56 MHz for a period of 15 seconds.

An initiation layer may be deposited on the underlying material, such as a silicon carbide layer that may comprise nitrogen or oxygen doped silicon carbide, to seed the deposition of subsequent dielectric layer, such as a silicon oxycarbide layer.

The initiation layer may comprise a silicon oxycarbide layer and may be deposited by an oxidizing gas and an organosilicon material, which organosilicon compound may be such compounds as described herein. The organosilicon compound and the oxidizing gas may be introduced into the processing chamber at a ratio of organosilicon compound (mgm) to oxidizing gas (sccm) of between about 1:2 and about 10:1, such as between about 1:2 and about 2:1, for example between about 1:2 and about 1:1. The initiation layer may be deposited at processing conditions approximately or equivalent to the subsequent dielectric material deposition, such as a silicon oxycarbide deposition.

The initiation layer and silicon oxycarbide layer may be deposited sequentially in situ by modifying the processing gas compositions. For example, the silicon oxycarbide layer may be deposited by introducing the organosilicon compound and the oxidizing gas into the processing chamber at a ratio of organosilicon compound (mgm) to oxidizing gas (sccm) of between about 10:1 or greater, such as between about 10:1 and about 201, for example about 18:1; and in situ processing may occur by changing the ratios of organosilicon compound and oxidizing gas between deposition of the initiation layer and silicon oxycarbide layer. The oxidizing gas may comprise an oxidizing compound selected from the group of oxygen, ozone, carbon monoxide, carbon dioxide, nitrous oxide, and combinations thereof, of which, oxygen is preferred.

The pre-treatment process may also be performed in situ with the initiation layer deposition and/or silicon oxycarbide layer deposition. All flow ratios between the organosilicon compound and the oxidizing gas for deposition process are described in units of mgm to sccm unless otherwise noted.

One embodiment of a deposition of dielectric initiation layer is as follows. The deposition may be performed by introducing an oxidizing compound at a flow rate between about 10 sccm and about 2000 sccm into the processing chamber, introducing an organosilicon precursor at a flow rate between about 100 milligrams/minute (mgm) and about 5000 mgm (which corresponds to between about 7 sccm and about 400 sccm for octamethylcyclotetrasiloxane (OMCTS)), and optionally, supplying a noble gas at a flow rate between about 1 sccm and about 10000 sccm, maintaining the chamber at a substrate temperature between about 0° C. and about 500° C., maintaining a chamber pressure between about 100 milliTorr and about 100° Torr, positioning a gas distributor between about 200 mils and about 700 mils from the substrate surface, and applying a RF power of between about 0.03 watts/cm$^2$ and about 1500 watts/cm, such as between about 0.03 W/cm$^2$ and about 6.4 W/cm, which is a RF power level of between about 10 W and about 2000 W for a 200 mm substrate.

The power may be applied from a dual-frequency RF power source a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The initiation layer may be deposited for a period of time between about 1 second and 60 seconds, for example between about 1 and about 5 seconds, such as 2 seconds.

An example of a deposition of initiation layer comprises introducing oxygen at a flow rate of 500 sccm into the processing chamber, introducing octamethylcyclotetrasiloxane at a flow rate of about 500 milligrams/minute (mgm) (which corresponds to about 39 sccm for OMCTS), introducing helium at a flow rate of about 4800 sccm, maintaining the chamber at a substrate temperature of about 350° C., maintaining a chamber pressure of about 5 Torr, positioning a gas distributor at about 350 mils from the substrate surface, and applying a RF power of about 500 watts at 13.56 MHz and about 150 watts at 356 KHz. The process was performed between about 1 and about 5 seconds, preferably about 2 seconds.

In an alternative embodiment of the initiation layer formation, an oxygen plasma pre-treatment process may be initiated and applied for a first period of time, and then the organosilicon material may be introduced for the initiation layer deposition. This allows for contiguous pre-treatment of the deposited material by an oxidizing plasma and subsequent initiation layer deposition in situ prior to deposition of the subsequent dielectric material, which may also be performed in situ.

The dielectric material may comprise silicon oxycarbide deposited in one embodiment by introducing an oxidizing compound, such as oxygen, at a flow rate between about 10 sccm and about 2000 sccm into the processing chamber, introducing an organosilicon precursor at a flow rate between about 100 milligrams/minute (mgm) and about 5000 mgm (which corresponds to between about 7 sccm and about 400 sccm for OMCTS), and optionally, supplying a noble gas at a flow rate between about 1 sccm and about 10000 sccm, maintaining the chamber at a substrate temperature between about 0° C. and about 500° C., maintaining a chamber pressure between about 100 milliTorr and about 100 Torr, positioning a gas distributor between about 200 mils and about 700 mils from the substrate surface, and applying a RF power of between about 0.03 watts/cm and about 1500 watts/cm$^2$, such as between about 0.03 W/cm$^2$ and about 6.4 W/cm which is a RF power level of between about 10 W and about 2000 W for a 200 mm substrate. The power may be applied from a dual-frequency RF power source a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts.

An example of a deposition of a dielectric layer comprises introducing oxygen at a flow rate of 160 sccm into the processing chamber, introducing octamethylcyclotetrasiloxane at a flow rate of about 2900 milligrams/minute (mgm) (which corresponds to about 226 sccm for OMCTS), introducing helium at a flow rate of about 1000 sccm, maintaining the chamber at a substrate temperature of about 350° C., maintaining a chamber pressure of about 5 Torr, positioning a gas distributor at about 450 mils from the substrate surface, and applying a RF power of about 500 watts at 13.56 MHz and about 150 watts at 356 KHz. The initiation layer deposition process and the dielectric layer may be deposited in situ and contiguous by adjusting the precursor flow rates and other processing parameters.

EXAMPLES

The following examples demonstrate various embodiments of the adhesion processes described herein as compared to a standard interlayer stack to illustrate the improved interlayer adhesion. The samples were undertaken using a Producer™ 300 mm processing chambers, which includes a solid-state dual frequency RF matching unit with a two-piece quartz process kit, both fabricated and sold by Applied Materials, Inc., Santa Clara, Calif.

Test samples were prepared as follows. A stack of dielectric layers were deposited on a silicon substrate as follows. The substrate comprises a silicon substrate having about 1000 Å of oxide disposed thereon, about 250 Å of tantalum disposed on the oxide, about 4500 Å of copper disposed on the tantalum, about 2000 Å of silicon carbonitride disposed on the copper layer, and about 2000 Å of silicon oxycarbide deposited on the silicon carbonitride layer. The silicon carbonitride deposition and the silicon oxycarbide deposition may be one continuous plasma or may comprise two or more generated plasmas.

The silicon oxycarbide layer was deposited by introducing oxygen at a flow rate of 160 sccm into the processing chamber, introducing octamethylcyclotetrasiloxane at a flow rate of about 2900 milligrams/minute (mgm) (which corresponds to about 226 sccm for OMCTS), introducing helium at a flow rate of about 1000 sccm, maintaining the chamber at a substrate temperature of about 350° C., maintaining a chamber pressure of about 5 Torr, positioning a gas distributor at about 450 mils from the substrate surface, and applying a RF power of about 500 watts at 13.56 MHz and about 150 watts at 356 KHz.

Adhesion testing was performed on the test samples as follows. Between about 120 µm and about 150 µm of epoxy material with known delamination characteristics were deposited on the test samples. A layer of silicon was deposited thereon. The test samples were then baked or cured for one hour at approximately 190° C. and then cleaved into 1 cm by 1 cm samples and cooled to −170° C. with liquid nitrogen. The samples were then observed to determine delamination, which occurs at a weakest interlayer interface at a given temperature. The shrinkage of the epoxy at a given temperature correlates to the forces that are required to induce peeling. From this observation, a determination of adhesion can be calculated. Adhesion ($G_C$) is based on the formula $\sigma\sqrt{(h/2)}$, with h being the epoxy thickness and being the residual stress. The measured adhesion $G_C$ of an untreated or unmodified stack described above was about 3 J-m$^2$ with a dielectric constant of about 3.01 and delamination at the silicon carbonitride and silicon oxycarbide interface.

In one sample, sample #1, a helium plasma treatment was performed on the silicon carbonitride layer prior to deposition of the silicon oxycarbide layer by providing helium to a processing chamber at a flow rate of about 1500 sccm, maintaining a chamber pressure of about 5 Torr, maintaining a substrate temperature of about 350° C., positioning a gas distributor at about 450 mils from the substrate surface, and generating a plasma by applying a RF power level of about 300 W at a high frequency of about 13.56 MHz for a period of 15 seconds. The measured adhesion $G_C$ of helium processed stack of sample #1 was about 3.8 J-m$^2$ with a dielectric constant of about 3.03 and delamination did not occur at the silicon carbonitride and silicon oxycarbide interface.

In another sample, sample #2, a helium plasma treatment and initiation layer was performed on the silicon carbonitride layer prior to deposition of the silicon oxycarbide layer by the helium process described in sample #1 and an initiation layer deposition by introducing oxygen at a flow rate of 500 sccm into the processing chamber, introducing octamethylcyclotetrasiloxane at a flow rate of about 500 milligrams/minute (mgm) (which corresponds to about 39 sccm for OMCTS), introducing helium at a flow rate of about 4800 sccm, maintaining the chamber at a substrate temperature of about 350° C., maintaining a chamber pressure of about 5 Torr, positioning a gas distributor at about 350 mils from the substrate surface, and applying a RF power of about 500 watts at 13.56 MHz and about 150 watts at 356 KHz. The measured adhesion $G_C$ of helium processed stack of sample #2 was about 5.5 J-m$^2$ with a dielectric constant of about 3.06 and delamination did not occur at the silicon carbonitride and silicon oxycarbide interface.

Layer Deposition:

Silicon Oxycarbide Layers

The silicon oxycarbide layer generally comprises silicon, carbon, and between about 15 atomic % or greater of oxygen. Oxygen doped silicon carbide as described herein comprise less than about 15 atomic % of oxygen. A preferred silicon oxycarbide layer comprises silicon-oxygen bonds and silicon-carbon bonds that contribute to low dielectric constants and barrier properties. The carbon content of the deposited layer is between about 5 atomic % and about 30 atomic % excluding hydrogen atoms, and is preferably between about 10 atomic % and about 20 atomic % excluding hydrogen atoms. The deposited layers may contain C—H or C—F bonds throughout to provide hydrophobic properties to the silicon oxycarbide layer. The silicon oxycarbide layer may also contain hydrogen, nitrogen, or combinations thereof.

The silicon oxycarbide layers are deposited by oxidizing organosilicon compounds, including both oxygen-containing organosilicon compounds and oxygen-containing organosilicon compounds, as described herein. In a preferred aspect of the invention, the silicon oxycarbide layer is deposited by reacting an organosilicon compound comprising three or more alkyl groups with an oxidizing gas comprising ozone. The silicon oxycarbide layer may be deposited without an oxidizer if the organosilicon compound includes oxygen. The preferred organosilicon compounds include, for example:

trimethylsilane, $(CH_3)_3$—SiH
tetramethylsilane, $(CH_3)_4$—Si
1,1,3,3-tetramethyldisiloxane, $(CH_3)_2$—SiH—O—SiH—$(CH_3)_2$
hexamethyldisiloxane, $(CH_3)_3$—Si—O—Si—$(CH_3)_3$
2,2-bis(1-methyldisiloxanyl)propane, $(CH_3$—SiH$_2$—O—SiH$_2$—$)_2$—C(CH$_3)_2$
1,3,5,7-tetramethylcyclotetrasiloxane, —(—SiHCH$_3$—O—)$_4$-(cyclic)
octamethylcyclotetrasiloxane, —(—Si(CH$_3)_2$—O—)$_4$-(cyclic)
1,3,5,7,9-pentamethylcyclopentasiloxane, —(—SiHCH$_3$—O—)$_5$-(cyclic)
and fluorinated derivatives thereof.

The organosilicon compounds are oxidized during deposition of the silicon oxycarbide layer, preferably by reaction with oxygen ($O_2$), ozone ($O_3$), nitrous oxide ($N_2O$), carbon monoxide (CO), carbon dioxide ($CO_2$), water ($H_2O$), or combinations thereof, of which oxygen is preferred. When ozone is used as an oxidizing gas, an ozone generator typically converts about 15 wt. % of the oxygen in a source gas to ozone, with the remainder typically being oxygen. However, the ozone concentration may be increased or decreased based upon the amount of ozone desired and the type of ozone generating equipment used. Organosilicon compounds that contain oxygen may be disassociated to provide the oxygen. During deposition of the silicon oxycarbide layer, the substrate is maintained at a temperature between about −20° C. and about 500° C., and preferably is maintained at a temperature between about 170° C. and about 180° C.

For a plasma enhanced deposition of the silicon oxycarbide layer, the organosilicon material is deposited using a power density ranging between about 0.003 W/cm$^2$ and about 6.4 W/cm$^2$, which is a RF power level of between about 1 W and about 2000 W for a 200 mm substrate. Preferably, the RF power level is between about 300 W and about 1700 W. The RF power is provided at a frequency between about 0.01 MHz and 300 MHz. The RF power may be provided continuously or in short duration cycles wherein the power is on at the stated levels for cycles less than about 200 Hz, and the on cycles total between about 10% and about 50% of the total duty cycle. The deposition process of the low dielectric constant layer is performed in a substrate processing system described in more detail below. The silicon oxycarbide layer can be deposited continuously or with interruptions, such as changing chambers or providing cooling time, to improve porosity.

Alternatively, a dual-frequency system may be applied to deposit the silicon oxycarbide material. A dual-frequency source of mixed RF power provides a high frequency power in a range between about 10 MHz and about 30 MHz, for example, about 13.56 MHz, as well as a low frequency power in a range of between about 100 KHz and about 500 KHz, for example, about 350 KHz. An example of a mixed frequency RF power application may include a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The ratio of the second RF power to the total mixed frequency power is preferably less than about 0.2 to 1.0.

In one aspect, a cyclic organosilicon compound and an aliphatic organosilicon compound are reacted with an oxidizing gas in amounts sufficient to deposit a low dielectric constant layer on a semiconductor substrate, wherein the cyclic organosilicon compound comprises at least one silicon-carbon bond. The aliphatic organosilicon compound contains a silicon-hydrogen bond or a silicon-oxygen bond, preferably a silicon-hydrogen bond. For example, the cyclic organosilicon compound may be 1,3,5,7-tetramethylcyclotetrasiloxane or octamethylcyclotetrasiloxane and the aliphatic organosilicon compound may be trimethylsilane or 1,1,3,3-tetramethyldisiloxane.

In another aspect, both the cyclic organosilicon compound and the aliphatic organosilicon compound contain a silicon-hydrogen bond. For example, 1,3,5,7-tetramethylcyclotetrasiloxane and trimethylsilane or 1,1,3,3-tetramethyldisiloxane are blended and oxidized while applying RF power.

In one embodiment of plasma enhanced deposition, oxygen or oxygen containing compounds are dissociated to increase reactivity and to achieve desired oxidation of the deposited layer. RF power is coupled to the deposition chamber to increase dissociation of the compounds. The compounds may also be dissociated in a microwave chamber prior to entering the deposition chamber.

Although deposition preferably occurs in a single deposition chamber, for example, the DxZ™ processing chamber or the Producer™ processing chamber, both of which are commercially available for Applied Materials, Inc., or Santa Clara, Calif., the silicon oxycarbide layer can be deposited sequentially in two or more deposition chambers, e.g., to permit cooling of the layer during deposition. Additionally, the silicon oxycarbide and silicon carbide layers may be deposited in situ in the same chamber and deposited subsequently by using selective precursors and controlling the processing parameters and the composition of processing gases. For example, both the silicon carbide and silicon oxycarbide layer may be deposited using trimethylsilane with ammonia being used in the silicon carbide deposition to form a nitrogen doped silicon carbide, and subsequently using ozone during deposition of the silicon oxycarbide material.

Silicon Carbide Layers

The silicon carbide layer is deposited by reacting an organosilicon compound to form a dielectric layer comprising carbon-silicon bonds and a dielectric constant less than about 4. The silicon carbide layer is preferably an amorphous hydrogenated silicon carbide. The silicon carbide layer may be deposited in a plasma of an inert gas, hydrogen gas, or both. The silicon carbide dielectric layer may be a doped silicon carbide layer. The silicon carbide layer may be deposited as a barrier layer disposed adjacent a conductive material or dielectric layer or may be an etch stop deposited between one or more dielectric layers.

Examples of suitable organosilicon compounds used herein for silicon carbide deposition preferably include the structure:

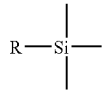

wherein R includes organic functional groups including alkyl, alkenyl, cyclohexenyl, and aryl groups, in addition to functional derivatives thereof. The organic precursors may have more than one R group attached to the silicon atom, and the invention contemplates the use of organosilicon precursors with or without Si—H bonds.

The organosilicon compounds include aliphatic organosilicon compounds, cyclic organosilicon compounds, or combinations thereof, having at least one silicon-carbon bond, and optionally, the structure may include oxygen. Cyclic organosilicon compounds typically have a ring comprising three or more silicon atoms. Aliphatic organosilicon compounds have linear or branched structures comprising one or more silicon atoms and one or more carbon atoms. Commercially s available aliphatic organosilicon compounds include organosilanes that do not contain oxygen between silicon atoms, and for oxygen doped silicon carbide layer, organosiloxanes that contain oxygen between two or more silicon atoms. Fluorinated derivatives of the organosilicon compounds described herein may also be used to deposit the silicon carbide and silicon oxycarbide layers described herein.

Examples of suitable aliphatic and cyclic organosilicon compounds include, for example, one or more of the following compounds:

Methylsilane, $CH_3—SiH_3$
Dimethylsilane, $(CH_3)_2—SiH_2$
Trimethylsilane (TMS), $(CH_3)_3—SiH$
Ethylsilane, $CH_3—CH_2—SiH_3$
Disilanomethane, $SiH_3—CH_2—SiH_3$
Bis(methylsilano)methane, $CH_3—SiH_2—CH_2—SiH_2—CH_3$
1,2-disilanoethane, $SiH_3—CH_2—CH_2—SiH_3$
1,2-bis(methylsilano)ethane, $CH_3—SiH_2—CH_2—CH_2—SiH_2—CH_3$
2,2-disilanopropane, $SiH_3—C(CH_3)_2—SiH_3$
1,3,5-trisilano-2,4,6-trimethylene, $—(—SiH_2CH_2—)_3—$ (cyclic).

The above list is illustrative and should not be construed or interpreted as limiting the scope of the invention.

Phenyl containing organosilicon compounds may also be used for depositing the silicon carbide materials and generally include the structure:

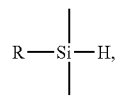

wherein R is a phenyl group. For example, suitable phenyl containing organosilicon compounds generally includes the formula $SiH_a(CH_3)_b(C_6H_5)_c$, wherein a is 0 to 3, b is 0 to 3, and c is 1 to 4, and a+b+c is equal to 4. Examples of suitable precursors derived from this formula include diphenylsilane, dimethylphenylsilane, diphenylmethylsilane, phenylmethylsilane, and combinations thereof. Preferably used are phenyl containing organosilicon compounds with b is 1 to 3 and c is 1 to 3. The most preferred organosilicon compounds for deposition as barrier layer materials include organosilicon compounds having the formula $SiH_a(CH_3)_b(C_6H_5)_c$, wherein a is 1 or 2, b is 1 or 2, and c is 1 or 2. Examples of preferred precursors include dimethylphenylsilane and diphenylmethylsilane.

Generally, the organosilicon compounds are reacted in a plasma comprising a relatively inert gas, such as nitrogen ($N_2$) and noble gases, such as helium or argon. The deposited silicon carbide layers have dielectric constants of about 5 or less, and the doped silicon carbide layers may have dielectric constants of about 3 or less.

A preferred silicon carbide layer is deposited in one embodiment by supplying trimethylsilane to a plasma processing chamber at a flow rate between about 10 milligrams/min (mgm) and about 5000 milligrams/min (mgm). Since conversion of milligram/minutes to standard cubic centimeters per minute (sccm) may vary between organosilicon compounds, milligrams/min is preferably used for organosilicon compounds. An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process. An example process for depositing a silicon carbide layer is disclosed in U.S. Pat. No. 6,537,733, issued on Mar. 25, 2003, which is incorporated by reference to the extent not inconsistent with the claims and disclosure described herein.

The silicon carbide layer may also be a doped silicon carbide layer containing oxygen, nitrogen, boron, phosphorus, or combinations thereof. Doped silicon carbide generally includes less than about 15 atomic percent (atomic %) or less of one or more dopants. Dopants may be used in the processing gases at a ratio of dopant to organosilicon compound between about 1:5 or greater, such as between about 1:5 and about 1:100.

An oxygen source or a nitrogen source may be used during the reaction to form the oxygen doped and/or nitrogen doped silicon carbide layers. Examples of oxygen sources include oxidizing gases, such as oxygen, ozone, carbon monoxide, carbon dioxide, nitrous oxide, and oxygen containing organosilicon precursor, or combinations thereof, such as carbon monoxide and an oxygen containing organosilicon precursor. Oxygen doped silicon carbide generally includes less than about 15 atomic percent (atomic %) of oxygen, preferably about 10 atomic % or less of oxygen.

The oxygen containing organosilicon compounds include, for example:

Dimethyldimethoxysilane, $(CH_3)_2$—Si—$(OCH_3)_2$ 1,3-dimethyldisiloxane, $CH_3$—$SiH_2$—O—$SiH_2$—$CH_3$ 1,1,3,3-tetramethyldisiloxane (TMDSO), $(CH_3)_2$—SiH—O—SiH—$(CH_3)_2$ Hexamethyidisiloxane (HMDS), $(CH_3)_3$—Si—O—Si—$(CH_3)_3$ 1,3-bis(silanomethylene)disiloxane, $(SiH_3$—$CH_2$—$SiH_2$—$)_2$—O Bis(1-methyldisiloxanyl)methane, $(CH_3$—$SiH_2$—O—$SiH_2$—$)_2$—$CH_2$ 2,2-bis(1-methyldisiloxanyl)propane, $(CH_3$—$SiH_2$—O—$SiH_2$—$)_2$—$C(CH_3)_2$ 2,4,6,8-tetramethylcyclotetrasiloxane (TMCTS)—(—Si—$HCH_3$—O—$)_4$-(cyclic)

octamethylcyclotetrasiloxane (OMCTS), —(—$Si(CH_3)_2$—O—$)_4$-(cyclic)

2,4,6,8,10-pentamethylcyclopentasiloxane, —(—Si—$HCH_3$—O—$)_5$-(cyclic)

1,3,5,7-tetrasilano-2,6-dioxy-4,8-dimethylene, —(—$SiH_2$—$CH_2$—$SiH_2$—O—$)_2$-(cyclic)

Hexamethylcyclotrisiloxane —(—$Si(CH_3)_2$—O—$)_3$-(cyclic)

1,3-dimethyldisiloxane, $CH_3$—$SiH_2$—O—$SiH_2$—$CH_3$ hexamethoxydisiloxane (HMDOS) $(CH_3O)_3$—Si—O—Si—$(OCH_3)_3$.

and fluorinated derivatives thereof.

Nitrogen doped silicon carbide may comprise up to 20 atomic % of nitrogen and may be deposited by the addition of nitrogen containing compounds including, for example, ammonia, nitrogen gas, a mixture of nitrogen and hydrogen gas, and compounds having Si—N—Si bonding groups, such as silazane compounds. Examples of suitable silazane precursors include aliphatic compounds, such as hexamethyidisilazane and divinyltetramethyldisilizane, as well as cyclic compounds, such as hexamethylcyclotrisilazane.

For example, a doped silicon carbide layer can be deposited by introducing an oxygen source and/or a nitrogen source, or other dopant, into the processing chamber at a flow rate between about 50 sccm and about 10,000 sccm. For example, a nitrogen containing or nitrogen doped silicon carbide layer may be deposited by introducing a nitrogen source, such as ammonia, nitrogen, a mixture of nitrogen and hydrogen, or combinations thereof, during deposition of the silicon carbide layer.

Phosphorus and/or boron doping of the low k silicon carbide layer may be performed by introducing phosphine ($PH_3$) or borane ($BH_3$), or borane derivative thereof, such as diborane ($B_2H_6$), into the chamber during the deposition process. It is believed that dopants may reduce the dielectric constant of the deposited silicon carbide material. Phosphorus and/or boron dopants may be introduced into the processing chamber at a flow rate between about 50 sccm and about 10,000 sccm.

Organic compounds, such as aliphatic hydrocarbon compounds may also be used in the processing gas to increase the carbon content of the deposited silicon carbide materials. Suitable aliphatic hydrocarbon compounds include compounds having between one and about 20 adjacent carbon atoms. The hydrocarbon compounds can include adjacent carbon atoms that are bonded by any combination of single, double, and triple bonds.

Example processes for depositing a nitrogen containing silicon carbide layer is disclosed in U.S. patent application Ser. No. 09/627,667, filed on Jul. 28, 2000 Feb. 23, 2001, and U.S. Pat. No. 6,537,733, issued on Mar. 25, 2003, which are incorporated by reference to the extent not inconsistent with the claims and disclosure described herein. An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein. An example process for depositing a boron and/or phosphorus silicon carbide layer is disclosed in U.S. patent application Ser. No. 10/342,079, filed on Jan. 13, 2003, which is incorporated by reference to the extent not inconsistent with the claims and disclosure described herein.

Generally, the organosilicon compound, inert gas, and optional dopant, are introduced to the processing chamber via a gas distribution plate spaced between about 200 millimeters (mm) and about 600 millimeters from the substrate on which the silicon carbide layer is being deposited. Power may be applied for a single or dual frequency RF power source. For example, power from a single 13.56 MHz RF power source is supplied to the chamber 10 to form the plasma at a power density between about 0.003 watts/cm and about 3.2 watts/cm, or a power level between about 1 watt and about 1000 watts for a 200 mm substrate. A power density between about 0.9 watts/cm$^2$ and about 2.3 watts/cm$^2$, or a power level between about 300 watts and about 700 watts for a 200 mm substrate, is preferably supplied to the processing chamber to generate the plasma.

Alternatively, a dual-frequency system may be applied to deposit the silicon carbide material. A dual-frequency source of mixed RF power provides a high frequency power in a range between about 10 MHz and about 30 MHz, for example, about 13.56 MHz, as well as a low frequency power in a range of between about 100 KHz and about 500 KHz, for example, about 350 KHz. An example of a mixed frequency RF power application may include a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The ratio of the second RF power to the total mixed frequency power is preferably less than about 0.2 to 1.0.

Additionally, the ratio of the silicon source to the dopant in the gas mixture should have a range between about 1:1 and about 100:1. The above process parameters provide a deposition rate for the silicon carbide layer in a range between about 100 Å/min and about 3000 Å/min when implemented on a 200 mm (millimeter) substrate in a deposition chamber available from Applied Materials, Inc., located in Santa Clara, Calif.

The embodiments described herein for depositing silicon carbide layers are provided to illustrate the invention, the particular embodiment shown should not be used to limit the scope of the invention. The invention also contemplates other processes and materials used to deposit silicon carbide layers.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
    positioning the substrate in a processing chamber, wherein the substrate has a barrier layer comprising at least silicon and carbon;
    introducing an organosilicon compound and an oxidizing gas at a first ratio of organosilicon compound to oxidizing gas into the processing chamber;
    generating a plasma of the oxidizing gas and the organosilicon compound to form an initiation layer on the barrier layer;
    introducing the organosilicon compound and the oxidizing gas at a second ratio of organosilicon compound to oxidizing gas greater than the first ratio into the processing chamber; and
    depositing a first dielectric layer adjacent the dielectric initiation layer, wherein the dielectric layer comprises silicon, oxygen, and carbon and has a dielectric constant of about 3 or less.

2. The method of claim 1, wherein the barrier layer further comprises oxygen or nitrogen.

3. The method of claim 1, wherein the organosilicon compound is selected from the group of trimethylsilane, 2,4,6,8-tetramethylcyclotetrasiloxane, octamethylcyclotetrasiloxane, and combinations thereof, and the oxidizing gas is selected from the group of oxygen, ozone, carbon monoxide, carbon dioxide, nitrous oxide, and combinations thereof.

4. The method of claim 1, wherein the depositing the initiation layer comprises generating a plasma by a dual-frequency RF power source.

5. The method of claim 1, wherein the depositing the first dielectric layer comprises generating a plasma by a dual-frequency RF power source.

6. The method of claim 1, wherein the first ratio of the organosilicon compound to the oxidizing gas comprises a ratio of about 1:1 and the second ratio of the organosilicon compound to the oxidizing gas comprises a ratio greater than or equal to about 10:1.

7. The method of claim 1, further comprising introducing an inert gas with the organosilicon compound and the oxidizing gas.

8. The method of claim 1, further comprising exposing the barrier layer to a plasma of an inert gas, an oxidizing gas, or both, prior to introducing the oxidizing gas and the organosilicon compound.

9. A method for processing a substrate, comprising:
    positioning the substrate in a processing chamber, wherein the substrate has a barrier layer comprising silicon, nitrogen, and carbon;
    introducing an inert gas into the processing chamber;
    generating a first plasma from a single-frequency RE power source to modify a surface of the barrier layer;
    introducing an organosilicon compound and an oxidizing gas in a ratio of about 1:1 into the processing chamber;
    generating a second plasma from a dual-frequency RE power source to form an initiation layer on the barrier layer;
    introducing the organosilicon compound and the oxidizing gas in a ratio of greater than or equal to about 10:1 into the processing chamber; and
    depositing a first dielectric layer adjacent the dielectric initiation layer, wherein the dielectric layer comprises silicon, oxygen, and carbon and has a dielectric constant of about 3 or less.

10. The method of claim 9, wherein the inert gas comprises helium, argon, or combinations thereof.

11. The method of claim 9, wherein the organosilicon compound is selected from the group of trimethylsilane, 2,4,6,8-tetramethylcyclotetrasiloxane, octamethylcyclotetrasiloxane, and combinations thereof, and the oxidizing gas is selected from the group of oxygen, ozone, carbon monoxide, carbon dioxide, nitrous oxide, and combinations thereof.

12. The method of claim 11, wherein an inert gas is introduced with the organosilicon compound.

13. A method for processing a substrate, comprising:
    positioning the substrate in a processing chamber, wherein the substrate has a barrier layer comprising at least silicon and carbon;
    introducing an oxidizing gas into the processing chamber;
    generating a plasma of the oxidizing gas and treating a surface of the barrier layer;
    introducing an organosilicon compound at a first flow rate;
    depositing an initiation layer on the barrier layer from the oxidizing gas and the organosilicon compound;
    introducing the organosilicon compound at a second flow rate greater than the first flow rate;
    depositing a first dielectric layer adjacent the dielectric initiation layer from the oxidizing gas and the organosilicon compound, wherein the dielectric layer comprises silicon, oxygen, and carbon and has a dielectric constant of about 3 or less.

14. The method of claim 13, wherein the barrier layer further comprises oxygen or nitrogen.

15. The method of claim 13, wherein the organosilicon compound is selected from the group of trimethylsilane, 2,4,6,8-tetramethylcyclotetrasiloxane, octamethylcyclotetrasiloxane, and combinations thereof, and the oxidizing gas is selected from the group of oxygen, ozone, carbon monoxide, carbon dioxide, nitrous oxide, and combinations thereof.

16. The method of claim 13, wherein the generating the plasma of the oxidizing gas comprises generating a plasma by a single-frequency RF power source and the depositing the initiation layer comprises generating a plasma by a dual-frequency RF power source.

17. The method of claim 13, wherein an inert gas is introduced with the organosilicon compound.

18. The method of claim 13, wherein the depositing the initiation layer comprises the organosilicon compound and oxidizing gas present in a ratio of about 1:1.

19. The method of claim 13, wherein the depositing the first dielectric layer comprises the organosilicon compound and oxidizing gas present in a ratio of greater than or equal to about 10:1.

20. A method for processing a substrate, comprising:
    positioning the substrate in a processing chamber, wherein the substrate has a barrier layer comprising at least silicon and carbon;
    introducing an oxidizing gas into the processing chamber;
    generating a plasma of the oxidizing gas; and forming an initiation layer on the barrier layer by exposing the barrier layer to the plasma of the oxidizing gas;
introducing an organosilicon compound into the processing chamber after forming the initiation layer;
reacting the organosilicon compound and the oxidizing gas; and
depositing a first dielectric layer adjacent the initiation layer, wherein the dielectric layer comprises silicon, oxygen, and carbon and has a dielectric constant of about 3 or less.

* * * * *